United States Patent [19]

Kuwabara et al.

[11] Patent Number: 5,469,395
[45] Date of Patent: Nov. 21, 1995

[54] DYNAMIC RANDOM ACCESS MEMORY DEVICE EQUIPPED WITH DIFERENTIAL AMPLIFIER FOR CELL PLATE LINE

[75] Inventors: Shinichi Kuwabara; Toshio Komuro, both of Tokyo, Japan

[73] Assignee: NEC Corporation, Tokyo, Japan

[21] Appl. No.: 162,284

[22] Filed: Dec. 7, 1993

[30] Foreign Application Priority Data

Dec. 7, 1992 [JP] Japan .................................. 4-326370

[51] Int. Cl.$^6$ ......................................................... G11C 7/00
[52] U.S. Cl. ............................ 365/207; 365/202; 365/203
[58] Field of Search ..................................... 365/203, 202, 365/207, 190

[56] References Cited

U.S. PATENT DOCUMENTS 4,873,664  10/1989  Eaton, Jr. .............................. 365/222 X
5,303,183   4/1994  Asakura ................................. 365/149
5,351,215   9/1994  Tanabe .................................. 365/203
5,353,255  10/1994  Komuro .............................. 365/203 X Primary Examiner—Do Hyun Yoo
Attorney, Agent, or Firm—Sughrue, Mion, Zinn, Macpeak & Seas

[57] ABSTRACT

A memory cell of a dynamic random access memory device is implemented by a series combination of a switching transistor and a storage capacitor connected between a bit line and a cell plate line, and a data bit stored in the storage capacitor produces a first potential difference indicative of the data bit between the bit line and another bit line paired therewith as well as a second potential difference between the cell plate of the storage capacitor and a cell plate line isolated therefrom, wherein a differential amplifier increases the second potential difference upon completion of a sense amplification on the first potential difference, thereby boosting the voltage level at the accumulating electrode of the storage capacitor while the bit lines and the cell plate line is being precharged again.

10 Claims, 8 Drawing Sheets

DYNAMIC RANDOM ACCESS MEMORY DEVICE EQUIPPED WITH DIFERENTIAL AMPLIFIER FOR CELL PLATE LINE

FIELD OF THE INVENTION

This invention relates to a dynamic random access memory device and, more particularly, to a dynamic random access memory device having a differential amplifier associated with a cell plate line for increasing a potential difference between bit lines.

DESCRIPTION OF THE RELATED ART

A dynamic random access memory device memorizes data information in an array of memory cells in the form of electric charge, and a dynamic memory cell of the one-transistor one-capacitor type is presently a majority. The transistors and the capacitors are progressively miniaturized for enhancing the integration density, and a step-down power voltage is distributed to the miniaturized memory cells. The step-down power voltage prevents the storage capacitor from damage. However, the amount of electric charge stored in each cell is decreased, and the storage capacitor can produce only small potential difference on an associated bit line pair. For this reason, a sense amplifier circuit coupled with the bit line pair suffers from a small margin between the actual potential difference and the minimum potential difference which it can accurately sense.

A solution has been proposed by Asakura et al. in "Cell-Plate Line Connecting Complementary Bitline ($C^3$) Architecture for Battery Operating DRAMs", VLSI Symposium on Circuit, pages 59 and 60. FIG. 1 illustrates the memory cell array disclosed by Asakura et al. First a, description is hereinafter made of the memory cell array.

Referring to FIG. 1, a cell plate line CPL extends between the bit lines BL1 and BL2 paired with each other, and memory cells MC1 and MC2 are alternately coupled between the bit lines BL1 and BL2 and the cell plate line CPL. Each of the memory cells MC1 and MC2 is implemented by a series of an n-channel enhancement type switching transistor Qn1 and a storage capacitor Cs1. The drain node of the n-channel enhancement type switching transistor Qn1 is connected with the associated bit line BL1 or BL2, and word lines WL1 and WL2 are selectively connected with the gate electrodes of the n-channel enhancement type switching transistors Qn1 of the memory cells MC1 and MC2. A data bit is stored in an accumulating electrode of the storage capacitor Cs1 in the form of electric charge, and the cell plate line CPL is shared between the counter electrodes of the storage capacitors Cs1. When the word line WL1 or WL2 goes up to a boosted voltage level Vboot higher than a positive power voltage Vcc by the threshold of the n-channel enhancement type switching transistors Qn1, the n-channel enhancement type switching transistor Qn1 coupled therewith turns on, and the associated storage capacitor Cs1 is connected with the associated bit line BL1 or BL2. As a result, the associated bit line BL1 or BL2 is slightly pulled up or down depending upon the amount of electric charge stored therein, and a small potential difference takes place between the bit lines BL1 and BL2.

A precharge/balance circuit 1 is associated with the cell plate line CPL and the bit lines BL1 and BL2, and is responsive to a precharge control signal PC for balancing the cell plate line CPL and the bit lines BL1 and BL2 at an intermediate voltage level Vm between the positive power voltage level Vcc and the ground voltage level. Namely, the precharge/balance circuit 1 comprises an n-channel enhancement type charging transistor Qn2 coupled between a precharge voltage line Vm and the cell plate line CPL, and n-channel enhancement type switching transistors Qn3 and Qn4 coupled between the cell plate line CPL and the bit lines BL1 and BL2. The precharge control signal PC is applied to the gate electrodes of the n-channel enhancement type switching transistors Qn2 to Qn4, and the cell plate line CPL and the bit lines BL1 and BL2 are charged to an intermediate voltage level between the positive power voltage Vcc and the ground voltage level.

A sense amplifier circuit 2 is further provided for the bit lines BL1 and BL2, and is responsive to an activation signal SE for developing the small difference.

The cell plate line CPL is connectable through n-channel enhancement type switching transistors Qn5 and Qn6 with the bit lines BL1 and BL2, and the n-channel enhancement type switching transistors Qn5 and Qn6 are selectively gated by dummy word lines DWL1 and DWL2. The dummy word lines DWL1 and DWL2 are complementarily driven to the word lines WL2 and WL1, respectively.

Subsequently, an access to the memory cell MC1 is hereinafter described with reference to FIG. 2 of the drawings. The precharge control signal PC remains in the power voltage level Vcc before the access, and the bit lines BL1 and BL2 and the cell plate line CPL are balanced at the intermediate voltage level Vm.

If the row address bits are changed to the address assigned to the word line WL1, the precharge control signal PC goes down to the ground voltage level at time t1, and the bit lines and the cell plate line CPL are electrically isolated from one another. A row address decoder/word line driver (not shown) lifts the word line WL1 toward the boosted voltage level Vboot at time t2, and the dummy word line DWL1 simultaneously goes up, leaving the other dummy word line DWL2 at the ground voltage level. As a result, the n-channel enhancement type switching transistor Qn1 of the memory cell MC1 connects the storage capacitor Cs1 with the bit line BL1, and the n-channel enhancement type switching transistor Qn6 connects the cell plate line CPL with the other bit line BL2.

The accumulating electrode N1 of the storage capacitor Cs1 and the bit line BL1 slightly go down to a voltage level Vx, and the other bit line BL2 goes up to a voltage level Vy. As a result, a potential difference dV takes place between the bit lines BL1 and BL2, and the potential difference dV is calculated as follows.

The accumulating electrode N1 is assumed to be charged to Vc, and Cb, Cc and Cs are indicative of the parasitic capacitance of each bit line BL1 or BL2, the parasitic capacitance of the cell plate line CPL and the capacitance of the storage capacitor Cs1. Equations 1 and 2 are established therebetween.

$$Cb(Vm)+Cs(Vc-Vm)=Cb \times Vx+Cs(Vx-Vy) \qquad (1)$$

$$(Cb-Cc)Vm+Cs(Vm-Vc)=(Cb+Cc)Vy+Cs(Vy-Vx) \qquad (2)$$

From Equations 1 and 2, the potential difference dV is given by Equation 3.

$$dV = Vx - Vy = (Vc - Vm)/[1 + A(1 + B)] \qquad (3)$$
$$= (Vc - Vm)/[1 + A(1 + B)/(1 + 2B)]$$

where A is Cb/Cs and B is Cb/Cc.

The activation signal SE goes up toward the high voltage level at time t3, and the sense amplifier circuit 2 starts developing the small potential difference dV between the bit lines BL1 and BL2. The data bit represented by the potential difference thus developed is restored in the memory cell MC1 again.

If the dummy word line system, i.e., the dummy word lines DWL1/DWL2 and the n-channel enhancement type switching transistors Qn5/Qn6 are not incorporated in the dynamic random access memory device, the cell plate line CPL is maintained at the ground voltage level, and B is zero. For this reason, the potential difference dV' between the bit lines BL1 and BL2 is given as $$dV=(Vs-Vm)/(1+A) \tag{4}$$

The ratio R between dV and dV' is calculated as $$R = (1 + A)/[1 + A(1 + B)/(1 + 2B)] \tag{5}$$
$$= (1 + A)/[(1 + A) - AB/(1 + 2B)] > 1$$

Thus, the dummy word line system effectively increases the initial potential difference between the bit lines BL1 and BL2. However, the progressive miniaturization of the circuit elements requires further to step down of the power voltage level, and the prior art dummy word line system can not fulfill the requirement.

SUMMARY OF THE INVENTION

It is therefore an important object of the present invention to provide a dynamic random access memory device which produces large potential differences on bit line pairs regardless of reduction in power voltage level.

To accomplish the object, the present invention proposes to change the voltage levels on cell plate lines after completion of sense amplification for boosting accumulating electrodes of storage capacitors.

In accordance with one aspect of the present invention, there is provided a dynamic random access memory device comprising: a) a plurality of addressable memory cells each implemented by a series combination of a first switching transistor and a storage capacitor for storing a data bit in the form of electric charge; b) a plurality of bit line pairs each having first and second bit lines, input-and-out nodes of the first switching transistors of the plurality of addressable memory cells being selectively connected with the first and second bit lines; c) an addressing means selectively connected with control nodes of the plurality of addressable memory cells, and operative to selectively connect the first or second bit lines of the plurality of bit line pairs through the input-and-output nodes to accumulating electrodes of the storage capacitors of addressed memory cells selected from the plurality of memory cells for producing first potential differences on the plurality of bit line pairs at a first timing; d) a plurality of cell plate lines respectively associated with the plurality of bit line pairs, and each split into first and second sections, the first and second sections of the plurality of cell plate lines being selectively connected with counter electrodes of the storage capacitors of the plurality of addressable memory cells, second potential differences being produced between the first sections and the second sections of the plurality of cell plate lines at the first timing; e) a precharging and balancing means operative to supply current from a current source to the first and second bit lines and the plurality of cell plate lines for balancing the first and second bit lines and the plurality of cell plate lines at a precharge level, the precharging and balancing means isolating the first and second bit lines and the plurality of cell plate lines from the current source and from one another at a second timing before the first timing; f) a plurality of sense amplifier circuits respectively connected with the plurality of bit line pairs for increasing the first potential differences on the plurality of bit line pairs at a third timing after the second timing; and g) a plurality of amplifying means respectively associated with the plurality of cell plate lines, and each having two amplifying nodes respectively connected with the first and second sections of the associated cell plate line for increasing the second potential difference at a fourth timing after the third timing, the addressing means isolating the accumulating electrodes from the first or second bit lines at a fifth timing after the fourth timing, the precharging and balancing means changing the voltage level on the plurality of cell plate lines for boosting the voltage levels at the accumulating electrodes of the addressed memory cells at a sixth timing after the fifth timing.

In accordance with another aspect of the present invention, there is provided a dynamic random access memory device comprising: a) at least one column of addressable memory cells each implemented by a series combination of a first switching transistor and a storage capacitor for storing a data bit in the form of electric charge; b) at least one bit line pair having first and second bit lines, input-and-out nodes of the first switching transistors of the at least one column of addressable memory cells being selectively connected with the first and second bit lines; c) an addressing means selectively connected with control nodes of the at least one column of addressable memory cells, and operative to selectively connect the first or second bit line through the input-and-output node to accumulating electrode of the storage capacitor of an addressed memory cell selected from the at least one column of addressable memory cells for producing a first potential difference between the first and second bit lines at a first timing; d) at least one cell plate line associated with the at least one column of addressable memory cells, and split into first and second sections, the first and second sections being selectively connected with counter electrodes of the storage capacitors of the at least one column of addressable memory cells, a second potential difference being produced between the first section and the second section at the first timing; e) a precharging means operative to supply current from a current source to the first and second bit lines for balancing the first and second bit lines at a precharge level, the precharging means isolating the first and second bit lines from the current source at a second timing before the first timing; f) at least one sense amplifier circuit connected with the at least one bit line pair for increasing the first potential difference at a third timing after the second timing; and g) at least one voltage controlling means having two control nodes respectively connected with the first and second sections for increasing the second potential difference at a fourth timing after the third timing, the addressing means isolating the accumulating electrode from the first or second bit lines at a fifth timing after the fourth timing, the at least one voltage controlling means changing the voltage level on the at least one cell plate line for boosting the voltage levels at the accumulating electrode of the addressed memory cell at a sixth timing after the fifth timing.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 1:
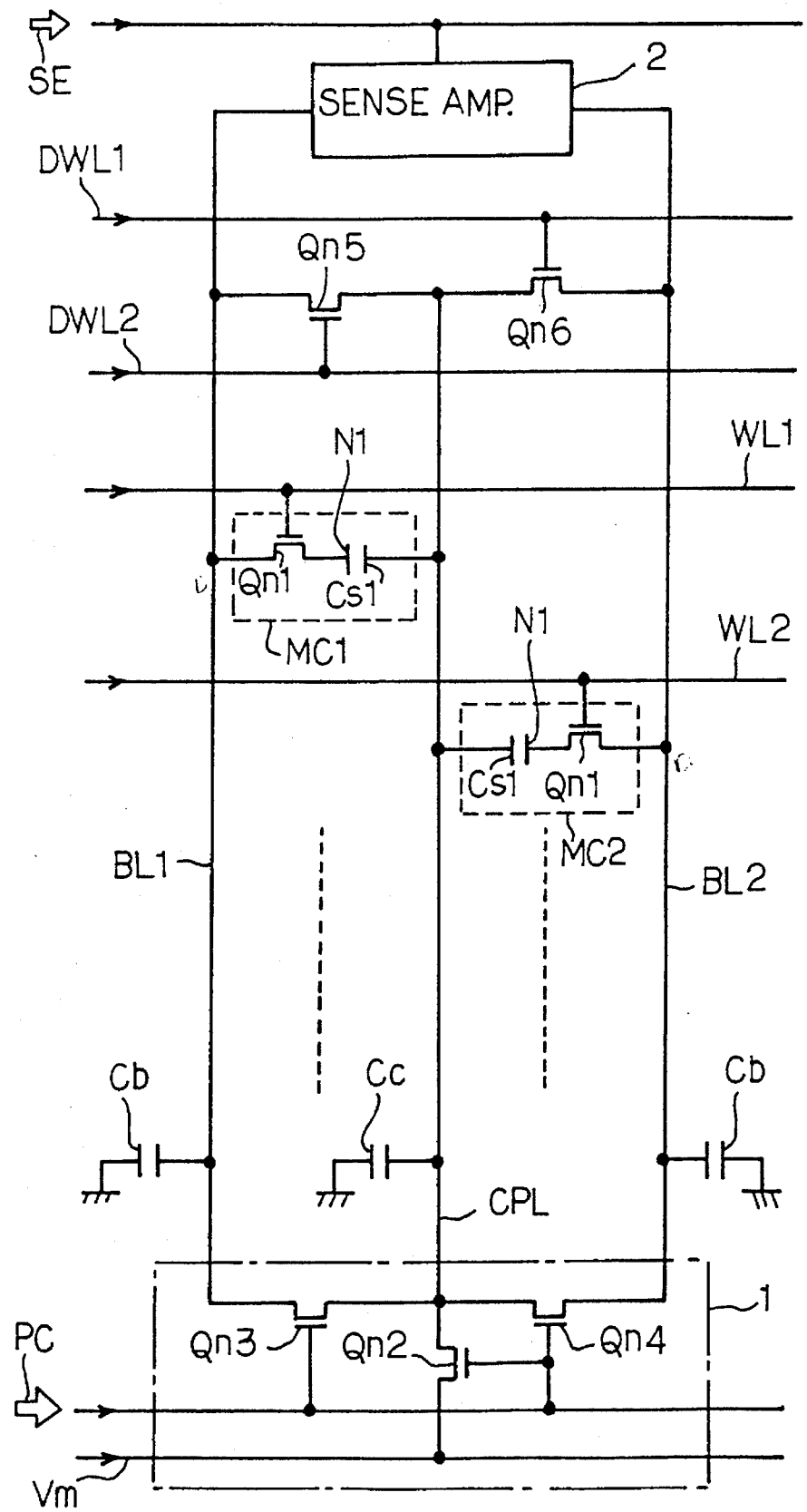
FIG. 1 is a circuit diagram showing the arrangement of the prior art dynamic random access memory device.
Figure 2:
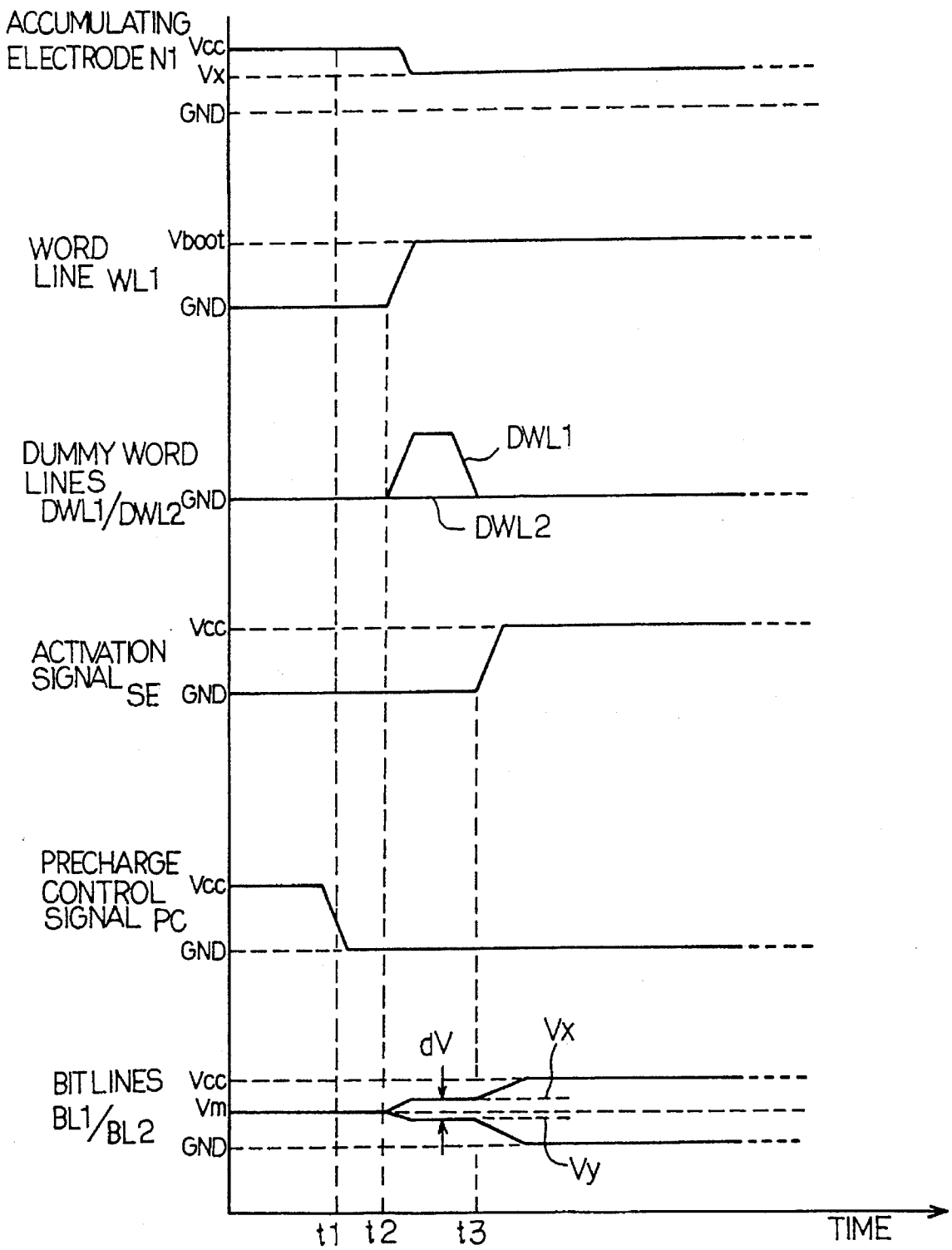
FIG. 2 is a timing chart showing the read-out sequence of the prior art dynamic random access memory device.
Figure 3:
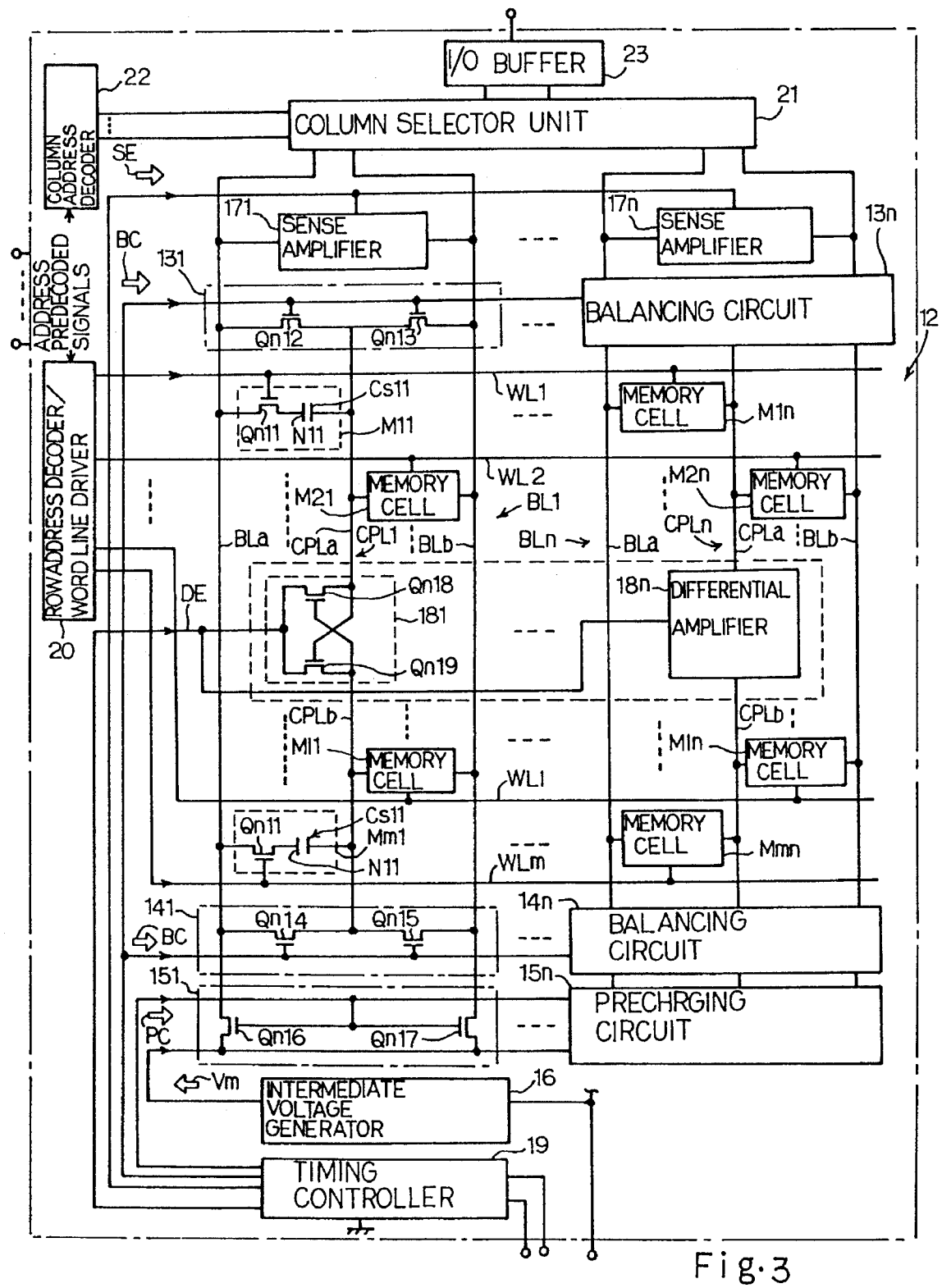
FIG. 3 is a circuit diagram showing the arrangement of a dynamic random access memory device according to the present invention.

Referring to FIG. 3 of the drawings, a dynamic random access memory device embodying the present invention is fabricated on a single semiconductor chip 11, and comprises a memory cell array 12 implemented by a plurality of memory cells M11 to M1n, M21 to M2n, . . . , Mll to Mln and Mm1 to Mmn. All of the memory cells M11 to Mmn are of a one-transistor one-capacitor type, and each has a series of an n-channel enhancement type switching transistor Qn11 and a storage capacitor Cs11. Data bits are stored in the respective storage capacitors Cs11 of the memory cells M11 to Mmn in the form of electric charge, and the amount of electric charge depends on the logic level of each data bit.

The memory cells M11 to Mmn are arranged in rows and columns, and word lines WL1, WL2, . . . , WLl and WLm are respectively associated with the rows of memory cells M11 to Mmn. Each of the word lines WL1 to WLm is connected with the gate electrodes of the n-channel enhancement type switching transistors Qn11 in the associated row of memory cells, and concurrently switches the n-channel enhancement type switching transistors Qn11 between on-state and off-state.

The columns of memory cells M11 to Mmn are associated with a plurality of bit line pairs BL1 to BLn, respectively, and each of the bit line pairs BL1 to BLn consists of first and second bit lines BLa and BLb. The drain nodes of the n-channel enhancement type switching transistors Qn11 of each column are alternately connected with the first and second bit lines BLa and BLb. While the n-channel enhancement type switching transistors Qn11 are turned on, the accumulating electrodes N11 of the associated storage capacitors Cs11 are connected with the associated bit lines BLa or BLb.

The columns of memory cells M11 to Mmn are further associated with cell plate lines CPL1 to CPLn, respectively, and each of the cell plate lines CPL1 to CPLn is split into first and second sections CPLa and CPLb. The counter electrodes of the storage capacitors in each column are connected with the associated cell plate line.

The first sections CPLa of the cell plate lines CLP1 to CLPn are connectable through first balancing circuits 131 to 13n with the bit line pairs BL1 to BLn. Namely, each of the first balancing circuits 131 to 13n is implemented by a pair of n-channel enhancement type balancing transistors Qn12 and Qn13, and the n-channel enhancement type balancing transistors Qn12 and Qn13 are connected between the first sections CPLa and the first and second bit lines BLa and BLb. A balance control signal BC is supplied to the gate electrodes of the n-channel enhancement type balancing transistors Qn12 and Qn13, and allows the first sections CPLa to be connected with the first and second bit lines BLa and BLb.

The second sections CPLb of the cell plate lines CLP1 to CLPn are connectable through second balancing circuits 141 to 14n with the bit line pairs BL1 to BLn. Namely, each of the second balancing circuits 141 to 14n is implemented by a pair of n-channel enhancement type balancing transistors Qn14 and Qn15, and the n-channel enhancement type balancing transistors Qn14 and Qn15 are connected between the second sections CPLb and the first and second bit lines BLa and BLb. The balance control signal BC is also supplied to the gate electrodes of the n-channel enhancement type balancing transistors Qn14 and Qn15, and allows the second sections CPLb to be connected with the first and second bit lines BLa and BLb.

A plurality of precharging circuits 151 to 15n are provided for the bit line pairs BL1 to BLn, respectively, and each of the precharging circuits 151 to 15n is implemented by a parallel combination of n-channel enhancement type charging transistors Qn16 and Qn17. The n-channel enhancement type switching transistors Qn16 and Qn17 are connected between an intermediate voltage generator 16 and the first and second bit lines BLa and BLb, and are concurrently gated with a precharge control signal PC. The intermediate voltage generator 16 produces an intermediate voltage Vm between a positive power voltage level Vcc and the ground voltage level GND, and the intermediate voltage Vm is supplied through the n-channel enhancement type charging transistors Qn16 and Qn17 to the first and second bit lines BLa and BLb in the presence of the precharge control signal PC of active high voltage level.

A plurality of sense amplifier circuits 171 to 17n are respectively connected with the bit line pairs BL1 to BLn, and a sense enable signal SE simultaneously activates the sense amplifier circuits 171 to 17n for developing small potential differences on the respectively bit line pairs BL1 to BLn.

A plurality of differential amplifier circuits 181 to 18n are provided for the cell plate lines CPL1 to CPLn, and each of the differential amplifier circuits 181 to 18n is implemented by a parallel combination of n-channel enhancement type amplifying transistors Qn18 and Qn19. The n-channel enhancement type amplifying transistors Qn18 and Qn19 are connected at drain nodes with the first and second sections CPLa and CPLb of the associated cell plate line and at source nodes with a discharging line DE. The gate electrodes of the n-channel enhancement type amplifying transistors Qn18 and Qn19 are respectively connected with the second and first sections CPLb and CPLa of the associated cell plate line. When a small potential difference takes place between the first and second sections CPLa and CPLb, the n-channel enhancement type amplifying transistors Qn18 and Qn19 are complementarily switched, and one of the first and second sections CPLa and CPLb is discharged to the discharging line DE.

The balance control signal BC, the precharge control signal PC and the sense enable signal SE are produced by a timing controller 19 at appropriate timings, and the discharge line DE is grounded through the timing generator 19 at a predetermined timing.

A row address decoder/word line driver unit 20 is connected with the word lines WL1 to WLm, and is responsive to row address predecoded signals for selectively driving to a boosted voltage level Vboot. The boosted voltage level Vboot is higher than the positive power voltage level Vcc by the threshold of the n-channel enhancement type switching transistors Qn11.

The bit line pairs Bl1 to BLn are terminated at a column selector unit 21, and a column address decoder unit 22 is responsive to column address predecoded signals so as to allow the column selector unit 21 to couple one of the bit line pairs BL1 to BLn with an input/output data buffer unit 23.

In this instance, the row address decoder/word line driver unit 20 and the word lines WL1 to WLm as a whole constitute an addressing means, and the first balancing circuits 131 to 13n, the second balancing circuits 141 to 14n and the precharging circuits 151 to 15n form in combination a precharging and balancing means. The differential amplifier circuits 181 to 18n serves as a plurality of amplifying means.

Figure 4:
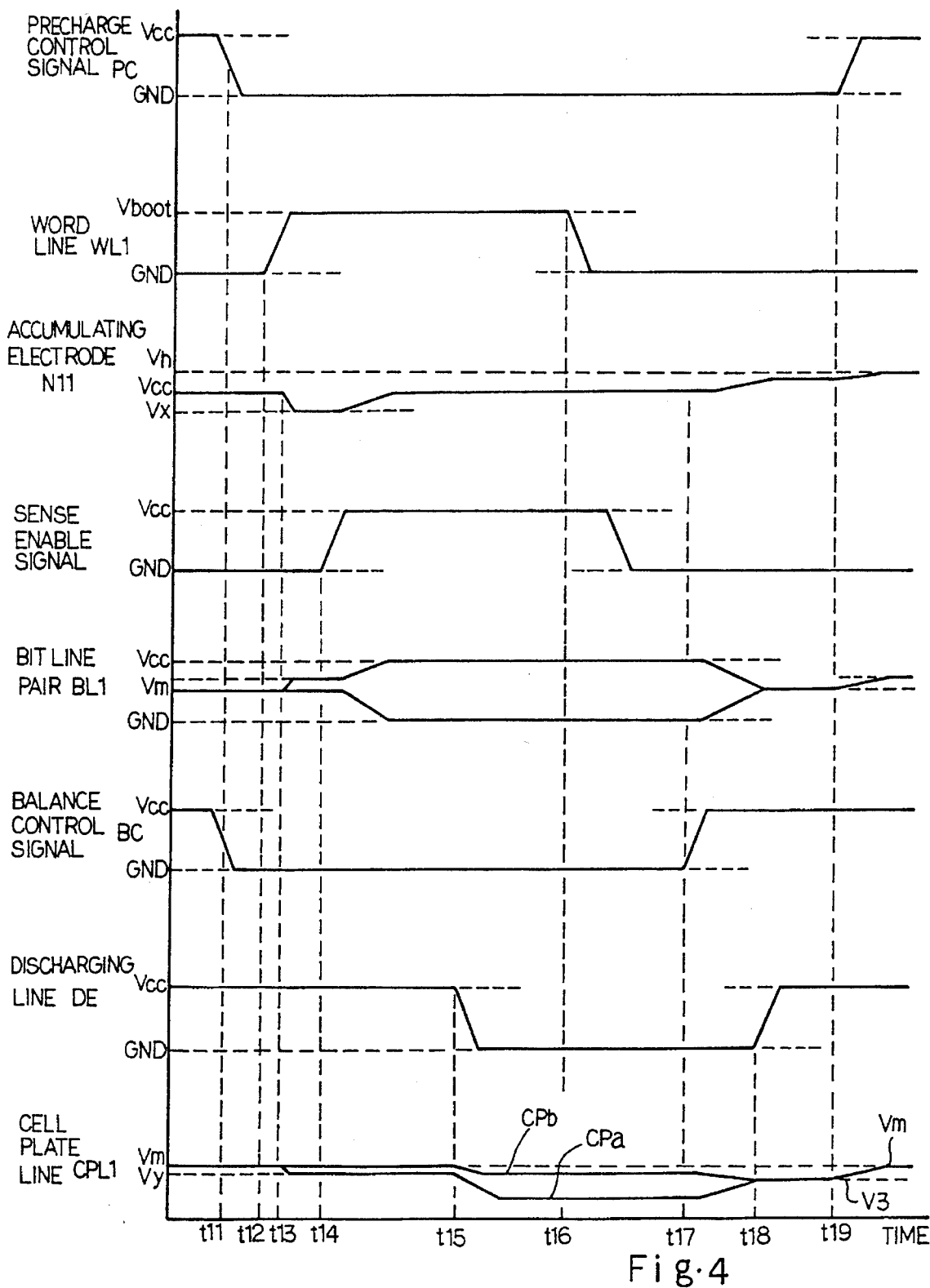
FIG. 4 is a timing chart showing a read-out sequence of the dynamic random access memory device shown in FIG. 3.

Description is hereinafter made on a read-out sequence with reference to FIG. 4 on the assumption that a data bit of logic "1" level stored in the memory cell M11 is accessed. The logic "1" is equivalent to a large amount of electric charge, and can lift the first bit line BLa coupled therewith when the storage capacitor Cs11 is connected to the first bit line BLa.

Assuming now that an external address signal changes the row address to the address assigned to the word line WL1, the timing controller 19 changes the precharge control signal PC and the balance control signal BC from the active power voltage level Vcc to the inactive ground voltage level at time t11, and isolates the first and second bit lines BLa and BLb and the cell plate lines CPL1 to CPLn already charged to the intermediate voltage level Vm from the intermediate voltage generator 16 as well as from one another.

The row address decoder/word line driver unit 20 starts the word line WL1 to go up toward the boosted voltage level Vboot in response to the row address predecoded signals produced from the external address signal at time t12, and the n-channel enhancement type switching transistors Qn11 of the memory cells M11 to M1n turn on so that the storage capacitors Cs11 are connected to the first bit lines BLa, respectively. As a result, the first bit lines BLa go up or down depending upon the data bits stored therein, and potential differences take place between the first bit lines BLa and the second bit lines BLb. The first bit lines BLa affect the accumulating electrodes N11, and change the voltage levels at the accumulating electrodes N11.

Since the memory cell M11 stores the data bit of logic "1" level, the first bit line BLa slightly goes up, and the accumulating electrode N11 goes down. The following equations are established.

$$Cd \times Vm + Cs(Vc-Vm) = Cd \times Vx + Cs(Vx-Vy) \quad (6)$$

$$Ccp \times Vm + Cs(Vm-Vc) = Ccp \times Vy + Cs(Vy-Vx) \quad (7)$$

where Vx is the voltage level on the first bit line BLa, Vy is the voltage level on the first section CPLa of the cell plate line CPL1, Cd is the parasitic capacitance of each bit line BLa or BLb, and Ccp is the parasitic capacitance of the first section CPLa.

From Equations 6 and 7, the voltage level Vx, which is the small potential difference dV on the bit line pair BL1, is given by Equation 8.

$$Vx = [Vm(A \times Ccp + Cd) + Vc \times Ccp]/[Cd + Ccp(A+1)] \quad (8)$$

where A is Cd/Cs, and the potential difference dV between the first and second bit lines BLa and BLb is calculated as $$dV = Vx - Vm = (Vc - Vm)/(A + B^* + 1) \quad (9)$$

where B* is Cd/Ccp. The potential difference dV is propagated through the bit line pair BL1 to the sense amplifier circuit 171, and the other bit line pairs propagate the potential differences to the associated sense amplifier circuits.

The sense enable signal SE starts rising toward the power voltage level Vcc at time t14, and the sense amplifier circuits 171 to 17n begin to increase the potential differences. The first and second bit lines BLa and BLb of the bit line pair BL1 respectively move toward the power voltage level Vcc and the ground voltage level. The word line WL1 is staying at the boosted voltage level Vboot, and, for this reason, the voltage levels on the first bit lines BLa are restored in the respective storage capacitors Cs11.

The first bit line BLa of the bit line pair BL1 goes up to the power voltage level Vcc, and, accordingly, the accumulating electrode N11 reaches the power voltage level Vcc.

The discharging line DE is grounded at time t15, and the differential amplifier circuits 181 to 18n are activated for increasing the potential differences between the first sections CPLa and the second sections CPLb. For example, the first section CPLa of the cell plate line CPL1 is lower than the second section CPLb, and the first section CPLa goes down to the ground voltage level through the differential amplification. On the other hand, the second section CPLb becomes slightly lower than the intermediate voltage level Vm.

The word line WL1 is recovered from the boosted voltage level Vboot to the ground voltage level at time t16, and the accumulating electrodes N11 of the memory cells M11 to M1n are electrically isolated from the first bit lines BLa.

The balance control signal BC starts rising toward the positive power voltage level Vcc at time t17, and the first and second bit lines BLa and BLb and the cell plate lines CPL1 to CPLn are electrically connected to one another. As a result, the cell plate lines CPL1 to CPLn are pulled up to a certain voltage level V3, and the accumulating electrode N11 is boosted.

The discharging line DE is isolated from the ground voltage line at time t18, and the precharge control signal PC starts rising toward the power voltage level Vcc at time t19. The precharging circuits 151 to 15n charge the first and second bit lines BLa and BLb, and the first and second bit lines BLa and BLb and the cell plate lines CPL1 to CPLn are balanced at the intermediate voltage level Vm. This means that the accumulating electrode N11 of the memory cell M11 is further boosted, and the accumulating electrode N11 reaches a certain high voltage level Vh. The high voltage level Vh is equal to the sum of the power voltage level Vcc and the intermediate voltage level Vm.

In this instance, the balance control signal BC is recovered earlier than the precharge control signal PC, and the accumulating electrode N11 is boosted twice. However, the balance control signal BC and the precharge control signal PC may be concurrently recovered, thus causing the accumulating electrode N11 to be boosted once.

As will be appreciated from the foregoing description, the accumulating electrodes are boosted with the cell plate lines after the restore of the data bits, and the amount of accumulated charge is increased through the boosting operation. As a result, even through the power voltage level is further stepped down, the stored data bits can produce large potential differences on the bit lines, and the sense amplifier circuits effectively develop them. In fact, if Vc is Vcc, Vm is Vcc/2, A is 10 and B is 1, the prior art dynamic random access memory device can produce a potential difference dV of 0.065 Vcc, and the dynamic random access memory device according to the present invention can produce a potential difference dV of 0.077 Vcc on the assumption that 2B* is equal to B.

Second Embodiment

Figure 5:
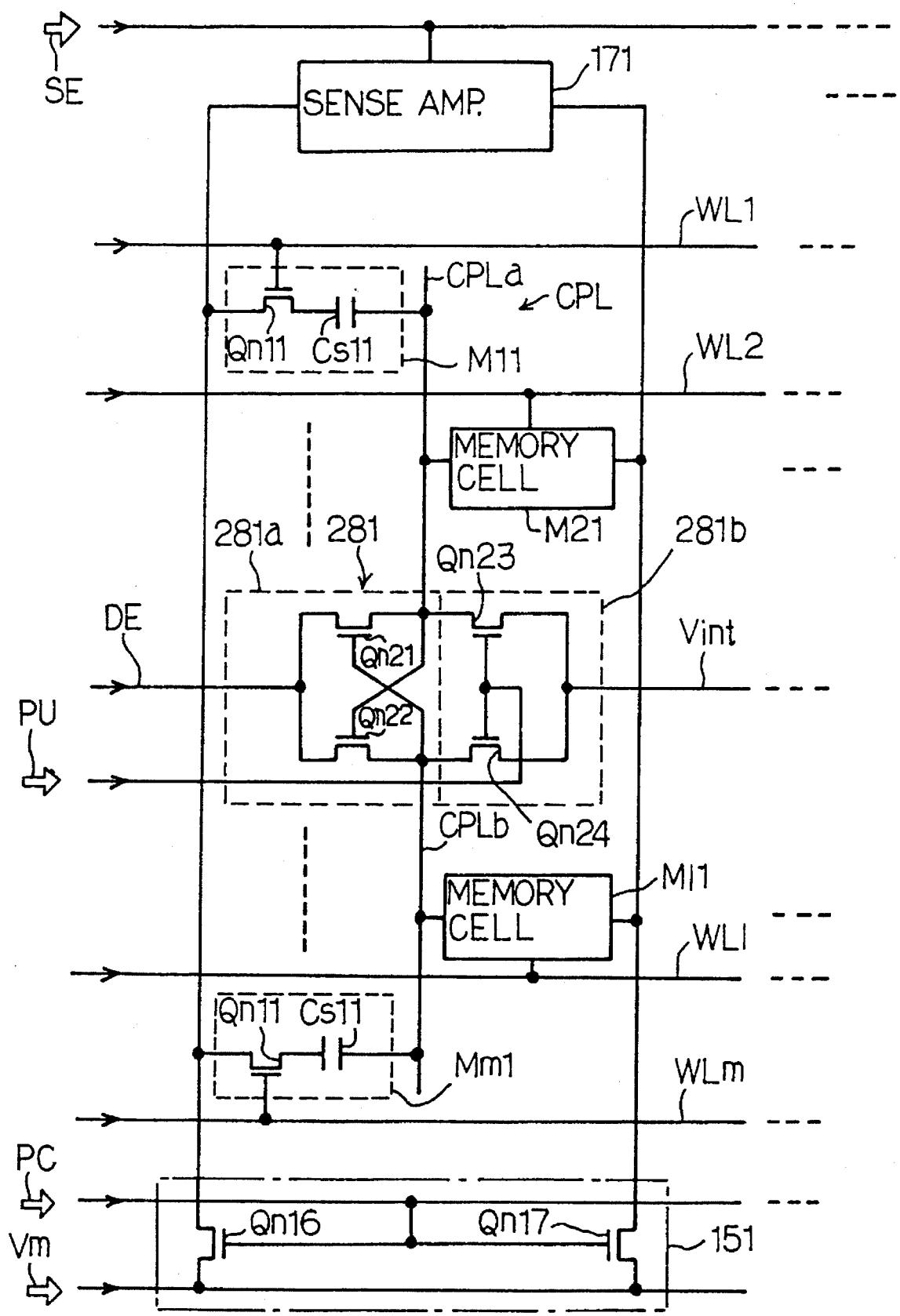
FIG. 5 is a circuit diagram showing the arrangement of another dynamic random access memory device according to the present invention.
Figure 6:
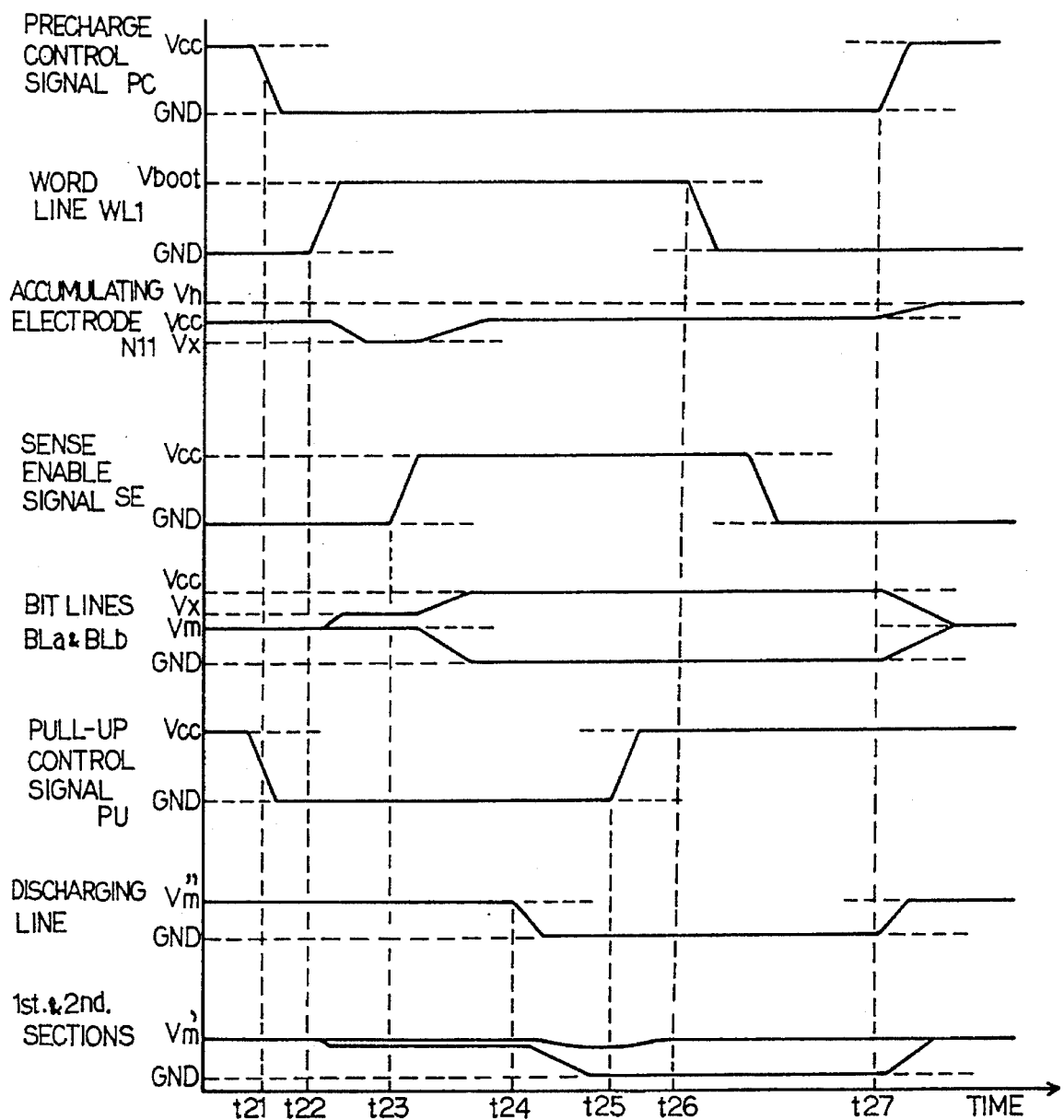
FIG. 6 is a timing chart showing a read-out sequence of the dynamic random access memory device shown in FIG. 5.

Turning to FIGS. 5 and 6 of the drawings, a column of memory cells M11, M21, ... Ml1 and Mm1 is coupled with first and second bit lines BLa and BLb paired with each other, and a precharging circuit 151, a sense amplifier circuit 171 and a voltage controller 281 are incorporated in another dynamic random access memory device embodying the present invention together with the column of memory cells M11 to Mm1. However, there is no balancing circuit incorporated in the dynamic random access memory device for balancing the first and second bit lines BLa and BLb and a cell plate line CPL split into first and second sections CPLa and CPLb. Although columns of memory cells are incorporated in the dynamic random access memory device, the other columns of memory cells and the associated circuits are deleted from FIG. 5 for the sake of simplicity. The memory cells M11 to Mmn, the sense amplifier 171 and the precharging circuit 151 are similar in circuit arrangement to those of the first embodiment, and the following description is focused on the voltage controller 281 only.

The voltage controller 281 is broken down into a differential amplifying section 281a and a pull-up section 281b. The differential amplifying section 281a comprises a parallel combination of n-channel enhancement type discharging transistors Qn21 and Qn22 coupled between the first and second sections CPLa and CPLb and a discharging line DE, and the gate electrodes of the n-channel enhancement type discharging transistors Qn21 and Qn22 are connected with the second and first sections CPLb and CPLa, respectively. Though not shown in FIG. 5, the discharging line DE can be grounded through a timing controller as similar to the first embodiment.

The pull-up section 281b comprises a parallel combination of n-channel enhancement type switching transistors Qn23 and Qn24 coupled between an internal step-down power voltage line Vint and the first and second sections CPLa and CPLb, and a pull-up control signal PU is supplied to the gate electrodes of the n-channel enhancement type switching transistors Qn23 and Qn24 at an appropriate timing.

Description is hereinafter made on a read-out cycle with reference to FIG. 6 on the assumption that a data bit of logic "1" level stored in the memory cell M11 is accessed.

Assuming now that an external address signal changes the row address to the address assigned to the word line WL1, the timing controller (not shown) changes the precharge control signal PC from the active power voltage level Vcc to the inactive ground voltage level at time t21, and isolates the first and second bit lines BLa and BLb already charged to the intermediate voltage level Vm from an intermediate voltage generator (not shown).

The pull-up control signal PU goes down at time t21, and the pull-up section 281b isolates the first and second sections already charged to a first predetermined voltage level Vm' from the internal power voltage line Vint, and the first predetermined voltage level Vm' is lower than the internal step-down power voltage level by the threshold of the n-channel enhancement type switching transistors Qn23 and Qn24.

A row address decoder/word line driver unit (not shown) starts the word line WL1 to go up toward the boosted voltage level Vboot in response to the row address predecoded signals produced from the external address signal at time t22, and the n-channel enhancement type switching transistors Qn11 of the memory cell M11 turns on so that the storage capacitors Cs11 is connected to the first bit lines BLa. As a result, the first bit line BLa goes up, and a potential difference takes place between the first bit line BLa and the second bit line BLb. The first bit line BLa affects the accumulating electrodes N11, and changes the voltage level at the accumulating electrode N11. On the contrary, the first section CPLa of the cell plate line CPL slightly goes down.

The potential difference is propagated through the bit line pair BL1 to the sense amplifier circuit 171.

The sense enable signal SE starts rising toward the power voltage level Vcc at time t23, and the sense amplifier circuit 171 begins to increase the potential difference on the bit line pair BL1. The first and second bit lines BLa and BLb respectively move toward the power voltage level Vcc and the ground voltage level. The word line WL1 is staying at the boosted voltage level Vboot, and, for this reason, the voltage level on the first bit line BLa is restored in the storage capacitor Cs11.

The first bit line BLa of the bit line pair BL1 goes up to the power voltage level Vcc, and, accordingly, the accumulating electrode N11 reaches the power voltage level Vcc.

The discharging line DE is grounded at time t24, and the differential amplifier section 281a is activated for increasing the potential difference between the first section CPLa and the second section CPLb. In this instance, the first section CPLa is lower than the second section CPLb, and the first section CPLa goes down to the ground voltage level through the differential amplification. On the other hand, the second section CPLb becomes slightly lower than the first predetermined voltage level Vm'.

The pull-up control signal PU starts rising toward the power voltage level Vcc at time t25, and the n-channel enhancement type switching transistors Qn23 and Qn24 turn on for supplying the internal step-down power voltage Vint to the first and second sections CPLa and CPLb. Then, the n-channel enhancement type switching transistors Qn23 and Qn24 slightly lift the first and second sections CPLa and CPLb. However, the large potential difference is maintained between the first and second sections CPLa and CPLb.

The word line WL1 is recovered from the boosted voltage level Vboot to the ground voltage level at time t26, and the accumulating electrode N11 of the memory cell M11 is electrically isolated from the first bit line BLa.

The discharging line DE is isolated from the ground voltage line at time t27, and the precharge control signal PC concurrently starts rising toward the power voltage level Vcc. The discharging line DE rises toward a second predetermined voltage level Vm" lower than the first predetermined voltage level Vm' by the threshold of the n-channel enhancement type amplifying transistors Qn21 and Qn22, and the n-channel enhancement type amplifying transistors Qn21 and Qn22 turn off. Then, the first section CPLa is lifted to the first predetermined voltage level Vm', and the accumulating electrode N11 is boosted to a high voltage level. As a result, the amount of charge accumulated in the electrode N11 is increased. The precharging circuit 151 charges the first and second bit lines BLa and BLb, and the first and second bit lines BLa and BLb are balanced at the intermediate voltage level Vm.

Thus, the pull-up section 281b boosts the accumulating electrode N11 directly over the power voltage level Vcc, and the dynamic random access memory device implementing the second embodiment achieves all the advantages of the first embodiment.

Third Embodiment

Figure 7:
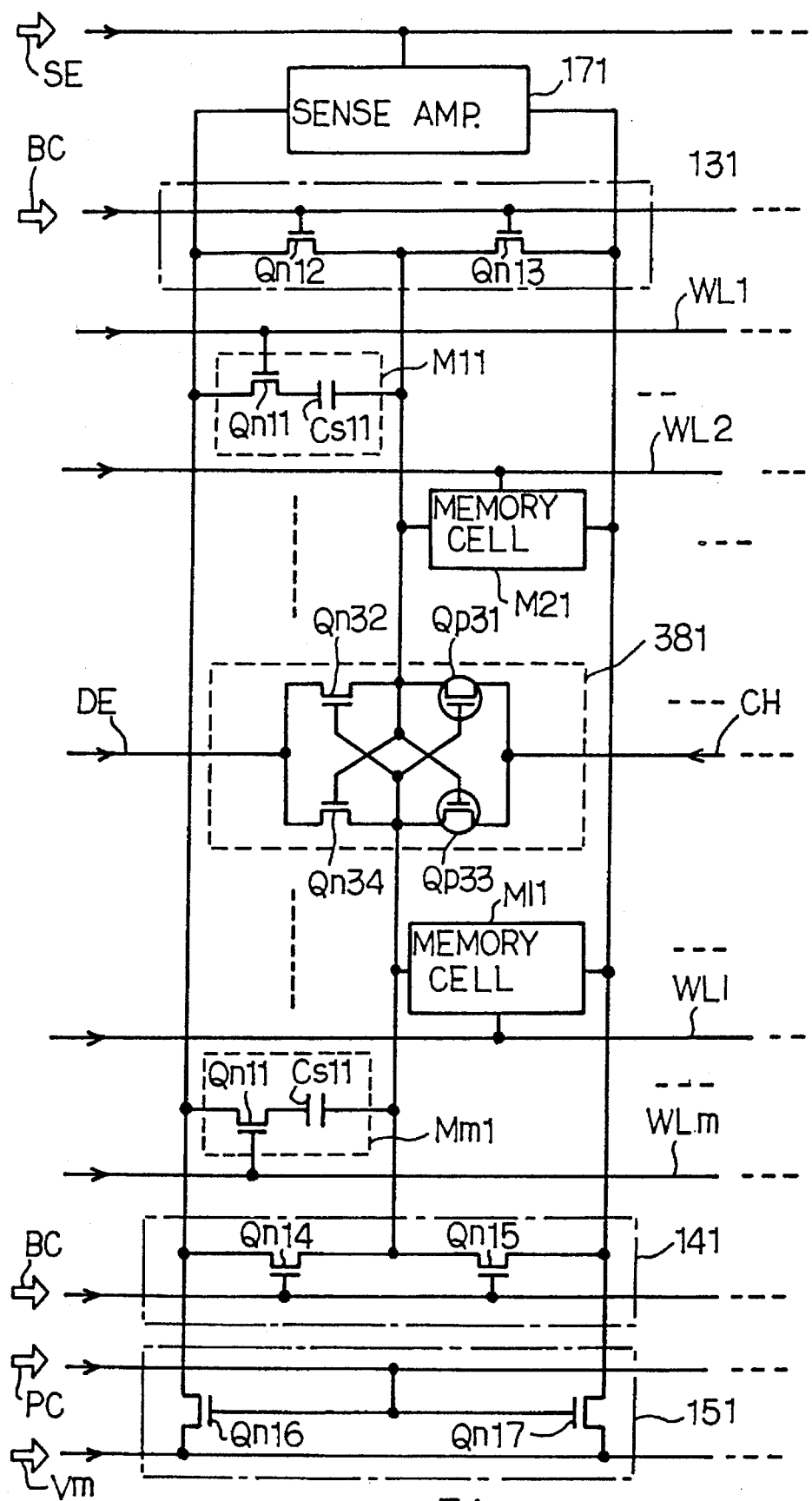
FIG. 7 is a circuit diagram showing the arrangement of yet another dynamic random access memory device according to the present invention.

Turning to FIG. 7 of the drawings, a column of memory cells M11, M21, ... Mll and Mm1 is coupled with first and second bit lines BLa and BLb paired with each other, and a first balancing circuit 131, a second balancing circuit 141, a precharging circuit 151, a sense amplifier circuit 171 and a differential amplifier circuit 381 are further incorporated in yet another dynamic random access memory device embodying the present invention together with the column of memory cells M11 to Mm1. Although columns of memory cells are incorporated in the dynamic random access memory device, the other columns of memory cells and the associated circuits are deleted from FIG. 7 for the sake of simplicity. The memory cells M11 to Mmn, the first and second balancing circuits 131 and 141, the sense amplifier circuit 171 and the precharging circuit 151 are similar in circuit arrangement to those of the first embodiment, and the following description is focused on the differential amplifier circuit 381 only.

The differential amplifier circuit 381 is implemented by two complementary inverters, i.e., parallel combinations of p-channel and n-channel enhancement type switching transistors Qp31/Qn32 and Qp33/Qn34. The drain nodes of the p-channel enhancement type switching transistors Qp31 and Qp33 are connected with a charging line CH, and the drain nodes of the n-channel enhancement type switching transistors Qn32 and Qn34 are connected with a discharging line DE. Though not shown in FIG. 7, the discharging line DE can be grounded through a timing controller as similar to the first embodiment, and the charging line CH supplies the power voltage level Vcc to the p-channel enhancement type switching transistors Qp31 and Qp33.

Figure 8:
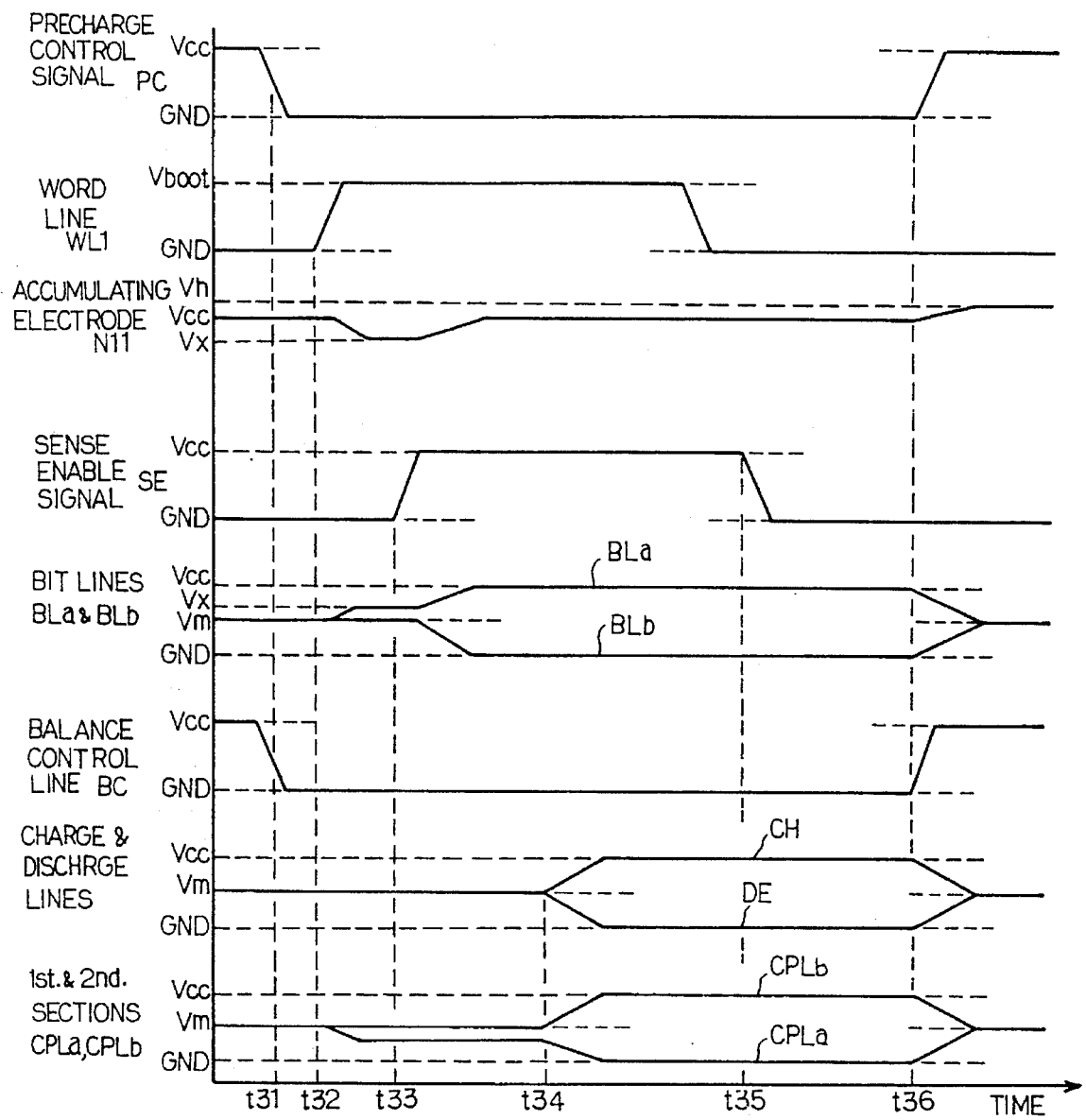
FIG. 8 is a timing chart showing a read-out sequence of the dynamic random access memory device shown in FIG. 7.

Description is hereinafter made on a read-out cycle with reference to FIG. 8 on the assumption that a data bit of logic "1" level stored in the memory cell M11 is accessed.

Assuming now that an external address signal changes the row address to the address assigned to the word line WL1, the timing controller (not shown) changes the precharge control signal PC and the balance control signal BC from the active power voltage level Vcc to the inactive ground voltage level at time t31, and isolates the first and second bit lines BLa and BLb and the cell plate line CPL already charged to the intermediate voltage level Vm from an intermediate voltage generator (not shown) and from one another.

A row address decoder/word line driver unit (not shown) starts the word line WL1 to go up toward the boosted voltage level Vboot in response to the row address predecoded signals produced from the external address signal at time t32, and the n-channel enhancement type switching transistors Qn11 of the memory cell M11 turns on so that the storage capacitors Cs11 is connected to the first bit lines BLa. As a result, the first bit lines BLa go up, and a potential difference takes place between the first bit line BLa and the second bit line BLb. The first bit line BLa affects the accumulating electrode N11, and changes the voltage level at the accumulating electrode N11. On the contrary, the first section CPLa of the cell plate line CPL slightly goes down.

The potential difference is propagated through the bit line pair BL1 to the sense amplifier circuit 171.

The sense enable signal SE starts rising toward the power voltage level Vcc at time t33, and the sense amplifier circuit 171 begins to increase the potential difference on the bit line pair BL1. The first and second bit lines BLa and BLb respectively move toward the power voltage level Vcc and the ground voltage level. The word line WL1 is staying at the boosted voltage level Vboot, and, for this reason, the voltage level on the first bit line BLa is restored in the storage capacitor Cs11.

The first bit line BLa of the bit line pair BL1 goes up to the power voltage level Vcc, and, accordingly, the accumulating electrode N11 reaches the power voltage level Vcc.

The discharging line DE is grounded at time t34, and the charging line CH concurrently supplies the power voltage level Vcc to the differential amplifier circuit 381. Then, the differential amplifier circuit 381 is activated for increasing the potential difference between the first section CPLa and the second section CPLb. In this instance, the first section CPLa is lower than the second section CPLb, and the first section CPLa goes down to the ground voltage level through the differential amplification. On the other hand, the second section CPLb goes up to the power voltage level Vcc.

The word line WL1 is recovered from the boosted voltage level Vboot to the ground voltage level at time t35, and the accumulating electrode N11 of the memory cell M11 is electrically isolated from the first bit line BLa.

The charging line CH and the discharging line DE are isolated from the power voltage source Vcc and the ground voltage line at time t36, and the precharge control signal PC and the balance control signal BC concurrently start rising toward the power voltage level Vcc.

The sense amplifier circuit 171 is disabled, and the first and second sections CPLa and CPLb are charged and balanced at the intermediate voltage level Vm. Therefore, the first section CPLa is lifted to the intermediate voltage level Vm, and the accumulating electrode N11 is boosted to a high voltage level Vh. As a result, the amount of charge accumulated in the electrode N11 is increased.

The dynamic random access memory device implementing the third embodiment achieves all the advantages of the first embodiment.

Although particular embodiments of the present invention have been shown and described, it will be obvious to those skilled in the art that various changes and modifications may be made without departing from the spirit and scope of the present invention. For example, a dynamic random access memory device may be fabricated on a plurality of semiconductor chips or on a single semiconductor chip together with another function blocks.

What is claimed is:

1. A dynamic random access memory device comprising:
   a) a plurality of addressable memory cells each implemented by a series combination of a first switching transistor and a storage capacitor for storing a data bit in the form of electric charge;

b) a plurality of bit line pairs each having first and second bit lines, input-and-out nodes of the first switching transistors of said plurality of addressable memory cells being selectively connected with said first and second bit lines of said plurality of bit line pairs;

c) an addressing means selectively connected with control nodes of said plurality of addressable memory cells, and operative to selectively connect said first or second bit lines of said plurality of bit line pairs through said input-and-output nodes to accumulating electrodes of the storage capacitors of addressed memory cells selected from said plurality of memory cells for producing first potential differences on said plurality of bit line pairs at a first timing;

d) a plurality of cell plate lines respectively associated with said plurality of bit line pairs, and each split into first and second sections, the first and second sections of said plurality of cell plate lines being selectively connected with counter electrodes of the storage capacitors of said plurality of addressable memory cells, second potential differences being produced between said first sections and said second sections of said plurality of cell plate lines at said first timing;

e) a precharging and balancing means operative to supply current from a current source to said plurality of bit line pairs and said plurality of cell plate lines for balancing said plurality of bit line pairs and said plurality of cell plate lines at a precharge level, said precharging and balancing means isolating said plurality of bit line pairs and said plurality of cell plate lines from said current source and from one another at a second timing before said first timing;

f) a plurality of sense amplifier circuits respectively connected with said plurality of bit line pairs for increasing said first potential differences on said plurality of bit line pairs at a third timing after said second timing; and g) a plurality of amplifying means respectively associated with said plurality of cell plate lines, and each having two amplifying nodes respectively connected with said first and second sections of the associated cell plate line for increasing the second potential difference at a fourth timing after said third timing, said addressing means isolating said accumulating electrodes from said first or second bit lines of said plurality of bit line pairs at a fifth timing after said fourth timing, said precharging and balancing means changing the voltage level on said plurality of cell plate lines for boosting the voltage levels at said accumulating electrodes of the storage capacitors of said addressed memory cells at a sixth timing after said fifth timing.

2. The dynamic random access memory device as set forth in claim 1, in which each of said plurality of amplifying means comprises a first amplifying transistor connected between one of said first and second sections of the associated cell plate line and a discharging line, and having a control gate connected with the other of said first and second sections, and a second amplifying transistor connected between the other of said first and second sections of said associated cell plate line and said discharging line, and having a control gate connected with said one of said first and second sections, said discharging line being coupled with a constant voltage source at said fourth timing.

3. The dynamic random access memory device as set forth in claim 2, in which said first and second sections of each cell plate line are approximately equal in length to one another.

4. The dynamic random access memory device as set forth in claim 1, in which said precharging and balancing means comprises a plurality of precharging circuits connected between a source of precharge level and said plurality of bit line pairs, and responsive to a precharge control signal shifted from an active level to an inactive level at said second timing, a plurality of first balancing circuits respectively associated with said plurality of bit line pairs and with the first sections of said plurality of cell plate lines, and each connecting said plurality of bit line pairs of the associated bit line pair and the first section of the associated cell plate line to one another while a balance control signal is staying at an active level, said balance control signal being shifted to an inactive level at said second timing for isolating said plurality of bit line pairs and said first section from one another, and a plurality of second balancing circuits respectively associated with said plurality of bit line pairs and with the second sections of said plurality of cell plate lines, and each connecting said plurality of bit line pairs of the associated bit line pair and the second section of the associated cell plate line to one another while said balance control signal is staying at said active level, said each of said plurality of second balancing circuits isolating said plurality of bit line pairs and said second section from one another when said balance control signal is shifted to said inactive level at said second timing, said balance control signal being shifted to an active level at said sixth timing for pulling up said first and second sections.

5. The dynamic random access memory device as set forth in claim 1, in which each of said plurality of amplifying means comprises:

a first complementary inverter coupled between a charging line and a discharging line, and having an output node connected with the first section of the associated cell plate line for serving as one of said two amplifying nodes and an input node connected with the second section of the associated cell plate line, and a second complementary inverter coupled between said charging line and said discharging line, and having an output node connected with the second section of said associated cell plate line for serving as the other of said two amplifying nodes and an input node connected with the first section of said associated cell plate line, said charging line and said discharging line supplying activating said first and second complementary inverters at said fourth timing, said charging line and said discharging line disabling said first and second complementary inverters at said sixth timing.

6. A dynamic random access memory device comprising:

a) at least one column of addressable memory cells each implemented by a series combination of a first switching transistor and a storage capacitor for storing a data bit in the form of electric charge;

b) at least one bit line pair having first and second bit lines, input-and-out nodes of the first switching transistors of said at least one column of addressable memory cells being selectively connected with said first and second bit lines;

c) an addressing means selectively connected with control nodes of said at least one column of addressable memory cells, and operative to selectively connect said first or second bit lines through the input-and-output node to accumulating electrode of the storage capacitor of an addressed memory cell selected from said at least one column of addressable memory cells for producing a first potential difference between said plurality of bit line pairs at a first timing;

d) at least one cell plate line associated with said at least one column of addressable memory cells, and split into first and second sections, said first and second sections being selectively connected with counter electrodes of the storage capacitors of said at least one column of addressable memory cells, a second potential difference being produced between said first section and said second section at said first timing;

e) a precharging means operative to supply current from a current source to said plurality of bit line pairs for balancing said plurality of bit line pairs at a precharge level, said precharging means isolating said first and second bit lines from said current source at a second timing before said first timing;

f) at least one sense amplifier circuit connected with said at least one bit line pair for increasing said first potential difference at a third timing after said second timing; and g) at least one voltage controlling means having two control nodes respectively connected with said first and second sections for increasing the second potential difference at a fourth timing after said third timing, said addressing means isolating said accumulating electrode of the storage capacitor of said addressed memory cell from said first or second bit lines at a fifth timing after said fourth timing, said at least one voltage controlling means changing the voltage level on said at least one cell plate line for boosting the voltage levels at said accumulating electrode of the storage capacitor of said addressed memory cell at a sixth timing after said fifth timing.

7. The dynamic random access memory device as set forth in claim 6, in which said at least one voltage controlling means comprises:

a differential amplifying section connected between said two control nodes and a discharging line for increasing said second potential difference, said discharging line activating said differential amplifying section at said fourth timing, said discharging line disabling said differential amplifying section at said sixth timing, and a pull-up section connected between a source of voltage level and said two control nodes for pulling up said two control nodes at a seventh timing between said fourth timing and said fifth timing.

8. The dynamic random access memory device as set forth in claim 7, in which said differential amplifying section comprises second and third switching transistors coupled between said first and second sections and said discharging line in parallel to each other, and having respective control gates connected with said second and first sections, respectively.

9. The dynamic random access memory device as set forth in claim 8, in which said pull-up section comprises fourth and fifth switching transistors connected between said source of voltage level and said first and second sections and responsive to a pull-up control signal for pulling up said first and second sections, said pull-up control signal activating said fourth and fifth switching transistors at said seventh timing.

10. A dynamic random access memory device comprising:

first and second bit lines paired with one another;

first and second cell plate lines extending in series along said first and second bit lines and approximately equal in length to one another;

a plurality of first memory cells each having a first switching transistor connected at one of source and drain nodes with said first bit line, and a first storage capacitor connected between the other of said source and drain nodes and said first cell plate line;

a plurality of second memory cells each having a second switching transistor connected at one of source and drain nodes with said second bit line, and a second storage capacitor connected between the other of said source and drain nodes of the second switching transistor and said second cell plate line;

first and second word lines respectively connected with a gate electrode of one of the plurality of said first switching transistors and a gate electrode of one of the plurality of said second switching transistors, said first and second word lines establishing a selected state in one of said plurality of first memory cells and one of said plurality of second memory cells, respectively, when being in a selected level;

a sense amplifier circuit for amplifying a potential difference between said first and second bit lines at a first predetermined timing;

a precharging circuit for charging said first and second bit lines at a second predetermined timing; and a differential amplifier circuit, connected between said first and second cell plate lines, for amplifying a potential difference between said first and second cell plate lines at a third predetermined timing, whereby the potential difference between the bit lines is increased.

\* \* \* \* \*

UNITED STATES PATENT AND TRADEMARK OFFICE
CERTIFICATE OF CORRECTION

PATENT NO.   : 5,469,395
DATED        : November 21, 1995
INVENTOR(S)  : Shinichi KUWABARA, Toshio KOMURO It is certified that error(s) appears in the above-identified patent and that said Letters Patent is hereby corrected as shown below:

Col. 11, line 45, delete "7", insert --5--.

Col. 15, line 8, after "said", delete "plurality of bit line pairs", insert --first and second bit lines--.

Col. 15, line 19, after "said", delete "plurality of bit line pairs", insert --first and second bit lines--.

Col. 15, line 20, after "said", delete "plurality of bit line pairs", insert --first and second bit lines--.

Signed and Sealed this

Ninth Day of July, 1996

Attest:

BRUCE LEHMAN

*Attesting Officer*          *Commissioner of Patents and Trademarks*